(12) United States Patent
Fish

(10) Patent No.: US 8,320,088 B2
(45) Date of Patent: Nov. 27, 2012

(54) POWER TRANSFER MECHANISM FOR USE IN TRANSMISSION AND DISTRIBUTION LEVEL ELECTRICAL POWER SYSTEMS

(75) Inventor: Roger Fish, Bedford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 149 days.

(21) Appl. No.: 12/972,598

(22) Filed: Dec. 20, 2010

(65) Prior Publication Data

US 2012/0154959 A1    Jun. 21, 2012

(51) Int. Cl.
*H02H 7/00* (2006.01)
*H02H 9/00* (2006.01)

(52) U.S. Cl. ....... 361/19; 174/15.3; 174/15.4; 174/15.5; 505/885

(58) Field of Classification Search .......................... None
See application file for complete search history.

(56) References Cited

U.S. PATENT DOCUMENTS

| | | | |
|---|---|---|---|
| 3,593,110 A * | 7/1971 | Huebener | 322/2 R |
| 7,375,933 B2 * | 5/2008 | Tekletsadik | 361/19 |
| 7,656,055 B2 * | 2/2010 | Torres et al. | 290/55 |
| 2007/0070559 A1 * | 3/2007 | Steinmeyer | 361/19 |

* cited by examiner

*Primary Examiner* — Jared Fureman
*Assistant Examiner* — Terrence Willoughby

(57) ABSTRACT

An improved power transfer mechanism is disclosed, which is particularly beneficial in power transmission applications. The mechanism allows the SCFCL system to have more than one electrical reference. The use of hydraulic power simplifies the design of systems in which one part of the system is referenced to ground, while a second part of the system is referenced to a different voltage, typically much higher than ground. For example, the tank of the SCFCL system may not be connected to ground, while hydraulic power supply is referenced to ground. This embodiment is performed without the use of an electrically conductive path between the two parts of the system.

9 Claims, 3 Drawing Sheets

POWER TRANSFER MECHANISM FOR USE IN TRANSMISSION AND DISTRIBUTION LEVEL ELECTRICAL POWER SYSTEMS

BACKGROUND

In electric power transmission and distribution networks, fault current conditions may occur. A fault current condition is an abrupt surge in the current flowing through the network caused by faults or short circuits in the network. Causes of the faults may include lightning striking the network, and downing and grounding of the transmission power lines due to severe weather or falling trees. When faults occur, a large load appears instantaneously. The network, in response, delivers a large amount of current (i.e. overcurrent) to this load or, in this case, the faults. This surge or fault current condition is undesirable as the condition may damage the network or equipments connected to the network. In particular, the network and the equipment connected thereto may burn or, in some cases, explode.

One of the systems used to protect power equipment from damage caused by fault currents is a circuit breaker. When a fault current is detected, the circuit breaker mechanically opens the circuit and disrupts overcurrent from flowing. A Circuit Breaker typically take 3 to 6 power cycles (up to 0.1 seconds) to be triggered. During this time, damage can be done to the transmission line, transformers, and switchgear.

Another system to limit the fault current is a superconducting fault current limiter ("SCFCL") system. Generally, a SCFCL system comprises a superconducting circuit that exhibits almost zero resistivity below a critical temperature level $T_C$, a critical magnetic field level $H_C$, and a critical current level $I_C$. If at least one of the conditions is raised above the critical level, the circuit becomes quenched and exhibits resistivity.

During normal operation, the superconducting circuit of the SCFCL system is maintained below $T_C$, $H_C$, and $I_C$. During a fault, one or more the conditions is raised above the critical level $T_C$, $H_C$, and $I_C$. Instantaneously, the superconducting circuit in the SCFCL system is quenched and its resistance surges, thereby limiting transmission of the fault current. Following some time delay and after the short circuit fault is cleared, $T_o$, $H_o$ and $I_o$ are returned to normal values and current is transmitted through the network and the SCFCL system.

The SCFCL system may comprise an enclosure electrically decoupled from ground, such that the enclosure is electrically isolated from ground potential. In other embodiments, the enclosure may be grounded. The SCFCL system may also have first and second terminals, electrically connected to one or more current carrying lines; with a first superconducting circuit contained in the enclosure, where the first superconducting circuit electrically connected to the first and second terminals.

Referring to FIG. 1, there is shown an exemplary superconducting fault current limiting (SCFCL) system 100 according to the prior art. The SCFCL system 100 may comprise one or more modules 110. For the purposes of clarity and simplicity, the description of SCFCL system 100 will be limited to one single phase module 110.

The module 110 of SCFCL system 100 may comprise an enclosure or tank 112 defining a chamber therein. In one embodiment, the enclosure or tank 112 may be thermally and/or electrically insulating tank 112 such as those made with fiberglass or other dielectric material. In another embodiment, the tank 112 is a metallic tank 112 comprising an inner and outer layers 112a and 112b, and a thermally and/or electrically insulating medium interposed therebetween. In this case, the tank 112 is not connected to earth ground, and is referred to as a floating tank configuration.

Within the tank 112, there may be one or more fault current limiting units 120 which, for the purpose of clarity and simplicity, are shown as a block. The module 110 may also comprise one or more electrical bushings 116. The distal end of the bushings 116 may be coupled to a respective current line 142 via terminals 144 and 146 to couple the SCFCL module 110 to the transmission network (not shown). The current lines 142 may be transmission lines used to transmit power from one location to another (e.g. current source to current end users), or power or current distribution lines. The inner conductive material in the bushings 116 may connect the terminal 144 and 146 of the bushing 116 to the fault current limiting unit 120. Meanwhile, the outer insulator is used to insulate the enclosure or tank 112 from the inner conductive material, thereby allowing the tank 112 and the terminals 144 and 146 to be at different electrical potentials. If desired, SCFCL module 110 may comprise optional internal shunt reactor 118 or an external shunt reactor 148, or both, to connect the conductive material contained in the electrical bushings 116.

Several insulated supports may be used to insulate various voltages from one another. For example, insulated supports 132 within the tank 112 are used to isolate the voltage of the module 120 from the tank 112. Supports 134 are used to isolate the platform 160 and the components resting thereon from ground.

The temperature of one or more fault current limiting units 120 may be maintained at a desired temperature range by coolant 114 in the tank 112. In one embodiment, it may be desirable to maintain the fault current limiting units 120 at a low temperature, for example, ~77° K. To maintain at such a low temperature range, liquid nitrogen or another cryogenic gas may be used as the coolant 114.

This coolant 114 may be cooled using an electrical cooling system. This cooling system may include a cryogenic compressor 117 and a transformer 115. This cooling system may require 15-20 kW of energy to provide 1 kW of cooling at liquid nitrogen temperatures. Thus the transformer 115 may need to supply large amounts of power. Additionally, the transformer 115, which is typically at ground potential, outputs voltages in excess of 100 kV.

In addition, in the case of a floating tank configuration, it is necessary to supply that electrical power at a voltage at or above that of the tank 112. In transmission systems, the tank 112 may be biased at 110 kV, 220 kV, 345 kV or 500 kV. Designing the transformers 115 needed to output this amount of power at these voltages is a significant challenge. In addition, to electrically isolate the floating tank, it is often necessary to place the tank 112 on a platform 160, which is elevated from the ground using insulated supports 134. This platform 160 may be 6-10 feet or more above the ground.

Thus, an issue associated with this configuration is the need to provide electrical power at the potential of the current carrying lines, which may be as high as between 10 kV and 350 kV. As described above, this electrical power may be used to power the cooling system required to keep the SCFCL system at the desired temperature. The typical solution to providing power across such large voltage potentials is the use of a transformer, which may be very large, such as hundreds of kV, and very expensive. Furthermore, such transformers are vulnerable to lightning strikes and other failure mechanisms.

Therefore, an improved system for providing electrical power to SCFCL systems is needed.

SUMMARY

An improved power transfer mechanism is disclosed, which is particularly beneficial in power transmission applications. The mechanism allows the SCFCL system to have more than one electrical reference. The use of hydraulic power simplifies the design of systems in which one part of the system is referenced to ground, while a second part of the system is referenced to a different voltage, typically much higher than ground. For example, the tank of the SCFCL system may not be connected to ground, while hydraulic power supply is referenced to ground. This embodiment is performed without the use of an electrically conductive path between the two parts of the SCFCL system.

BRIEF DESCRIPTION OF THE FIGURES

In order to facilitate a fuller understanding of the present disclosure, reference is now made to the accompanying drawings. These figures may not necessarily be drawn to scale. In addition, these figures should not be construed as limiting the present disclosure, but are intended to be exemplary only.

DETAILED DESCRIPTION

Figure 2:
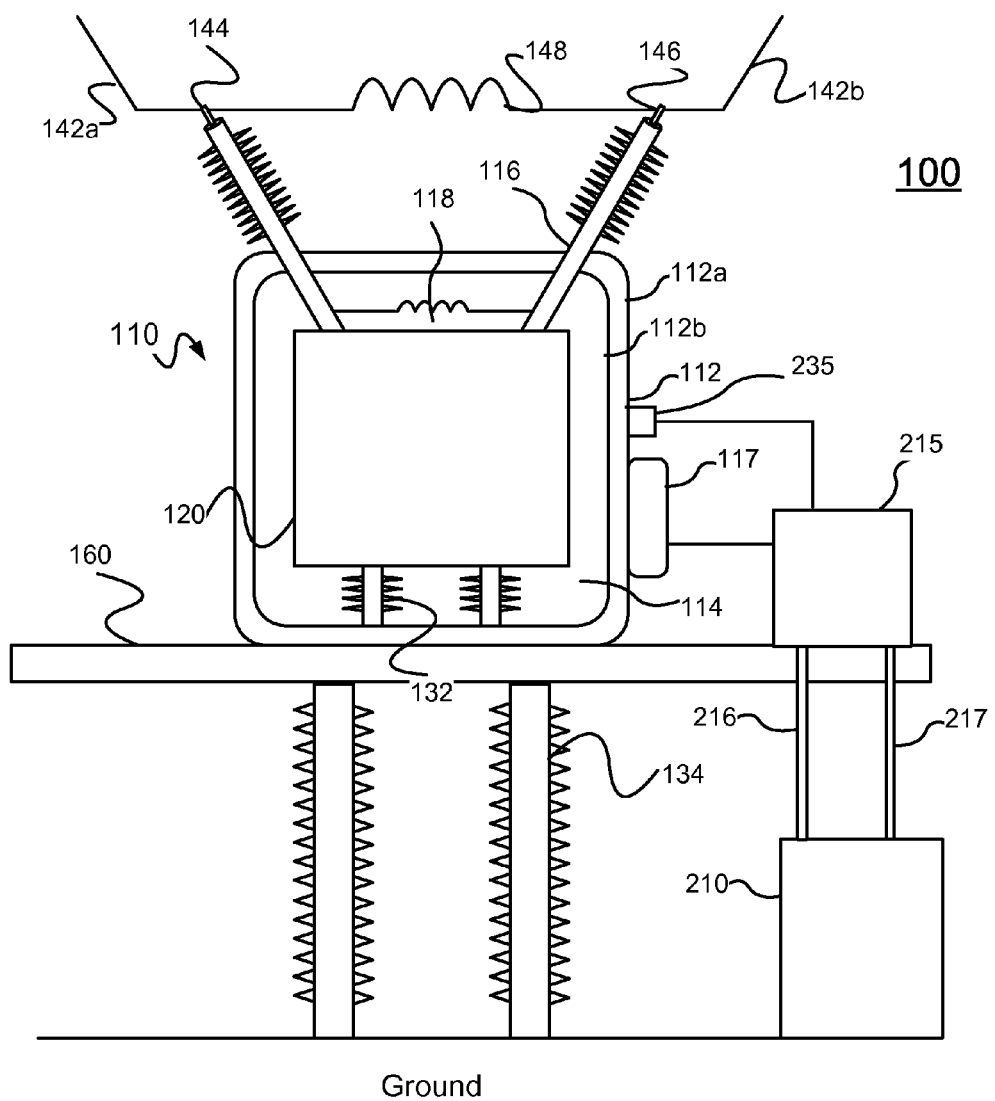
FIG. 2 shows an exemplary SCFCL system according to one embodiment of the present disclosure.

FIG. 2 shows a first embodiment of the present invention which incorporates a floating tank configuration. In a floating tank configuration, the tank 112 is not connected to ground or any other fixed voltage. Consequently, the tank 112 will tend to float to a voltage which is approximately equal to that of the power of current distribution lines, which may exceed several tens of kilovolts.

Figure 3:
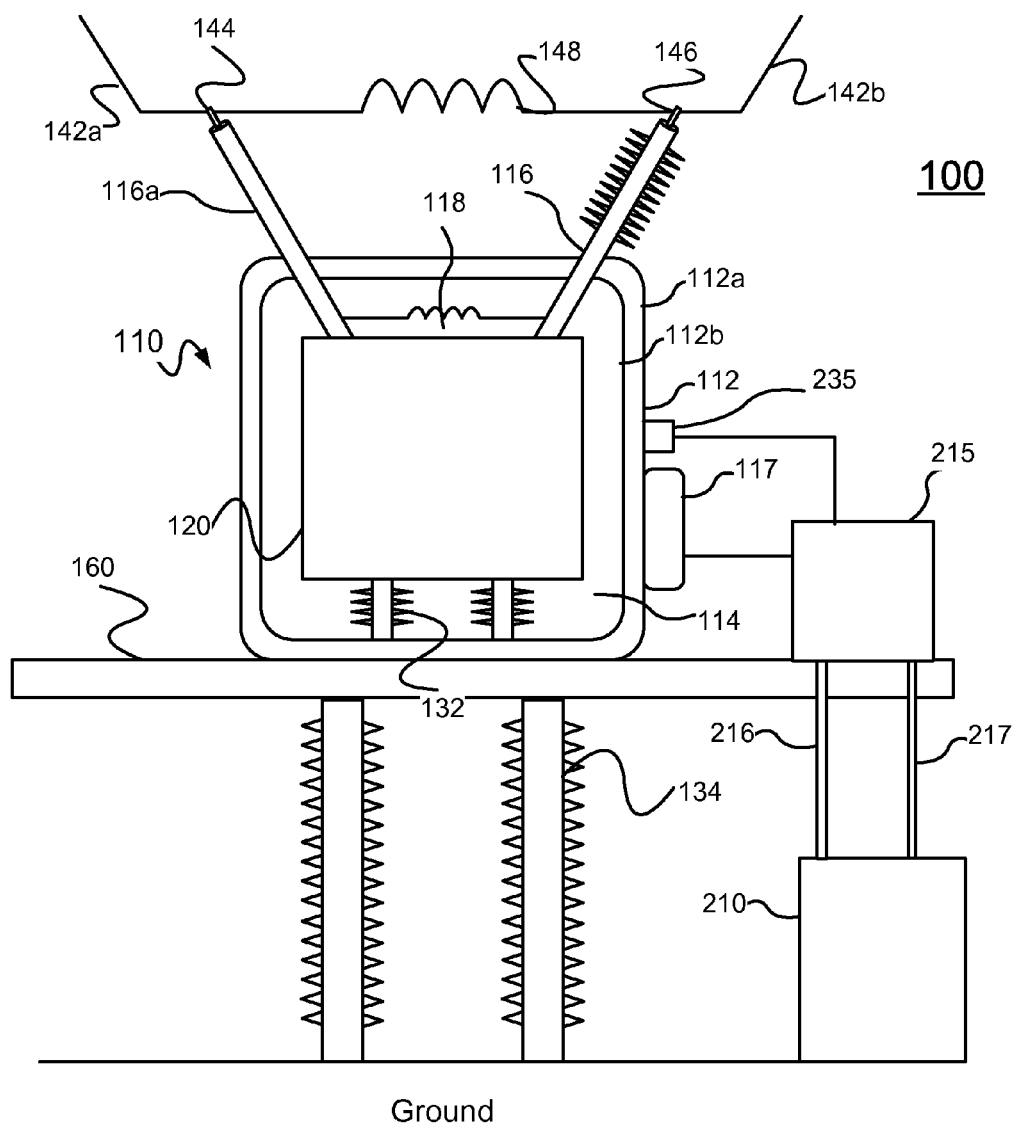
FIG. 3 shows an exemplary SCFCL system according to another embodiment of the present disclosure.

FIG. 3 shows a second embodiment of the present invention which incorporates a live tank configuration. In a live tank configuration, the tank 112 may be electrically connected to one of the terminals 144, 146, so as to be fixed at the voltage of the transmission network. In this case, the rod 116a is conductive so that terminal 144 is electrically connected to the tank 112. Such a configuration is also described in co-pending application Ser. No. 12/818,454, the disclosure of which is incorporated herein by reference in its entirety.

Figure 1:
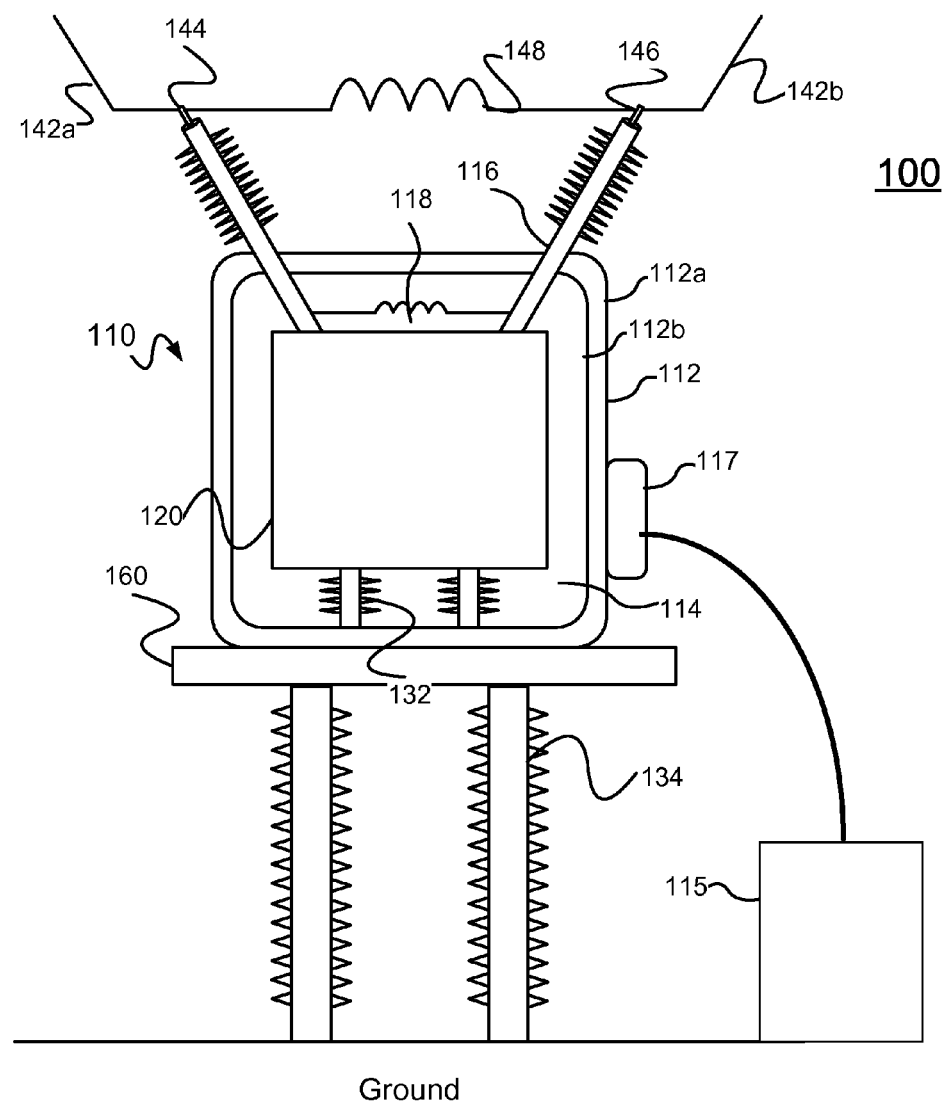
FIG. 1 shows an exemplary superconducting fault current limiting (SCFCL) system according to the prior art.

In both of these embodiments, the transformer 115 of the prior art (see FIG. 1) is replaced by a hydraulic system. The hydraulic system is comprised of three major components; a hydraulic power supply 210, an electrically non-conductive supply 216 and return 217 system; and a hydraulic motor/generator 215.

The hydraulic power supply 210 is configured to provide hydraulic fluid at a certain pressure and flow rate. The supply line 216 is configured to receive this hydraulic fluid from the hydraulic power supply 210 and transport it to the hydraulic motor/generator 215. The return system 217 returns the hydraulic fluid from the hydraulic motor/generator 215 to the power supply 210, thereby completing the closed loop system. The hydraulic motor/generator 215 may be a purely mechanical device, which receives the hydraulic fluid from the power supply 210 via the supply system 216 and generates mechanical power (i.e. a hydraulic motor). Alternatively, this component may be a hydraulic generator configured to receive the hydraulic fluid from the power supply 210 and generate electrical power.

Power delivered to the high potential region, (i.e. to the components on platform 160) may be utilized in two ways. In some embodiments, as described above, the pressure of the hydraulic fluid may be used directly to generate mechanical power (i.e. a hydraulic motor). In some embodiments, the pressure of the hydraulic fluid is used to generate electrical power, such as using hydraulic motor/generator 215.

Turning first to hydraulic power supply 210, there are a variety of commercially available components that may be utilized. One criteria of interest when selecting a power supply 210 is the dielectric breakdown voltage of the hydraulic fluids within the supply. The following table shows the breakdown voltages of several commercially available hydraulic fluids.

TABLE 1

| MFG | Fluid ID | Dielectric Voltage Kv (ASTMD877) |
|---|---|---|
| AMERILUBE | PGHD-XLT | >42 |
| Schaeffer | #275S DI-LEX | 45 |
| Conoco | Hyken Golden MV | 35 |
| Anderol | ROYCO 756 | 49.6 |

OSHA minimum requirement for mobile equipment used to repair electrical lines is 30 Kv In addition, a number of commercial hydraulic fluids are available having a dielectric strength from 35 to 50 Kv.

Turning next to the electrically non-conductive supply 216 and return 217 system, a variety of conduits are commercially available. In some embodiments, these conduits are hoses, having a synthetic rubber cover, with a synthetic rubber inner tube. Reinforcement of the hoses may be achieved through the use of braids, such as fiber braids. Note that all of the components of these conduits are electrically non-conductive. Commercially available hoses are available, having inner diameters between ¼" and 1" and working pressures up to 1250 psi.

Turning to the hydraulic motor/generator 215, again a variety of commercially components exist. For example, a hydraulic generator, such as the Model Hydro 8KCD-16-3 available from Fabco Power, can be used. To significantly reduce the voltages needed from the hydraulic motor/generator 215, the output from the hydraulic motor/generator 215 may be referenced to the tank 112. In other words, the voltage of tank 112 serves as the ground reference for at least some of the electrical components located on platform 160. The output from the generator 215 is used to power the cryogenic compressor 117 and other components 235 which may be referenced to the voltage of the tank 112. Other components 235 may include control and sensor electronics, and other mechanical components, such as valves, vents or pumps. In some embodiments, all components located on platform 160 are referenced to the tank 112, and are powered by hydraulic generator 215.

The use of hydraulic power simplifies the design of systems in which one part of the system is referenced to ground, while a second part of the system is referenced to a different voltage, typically much higher than ground. This embodiment is performed without the use of an electrically conductive path between the two parts of the system. In the case of SCFCL systems, this allows the generation of electrical power, such as for the cryogenic compressor 117 or other components 235, at a voltage which is referenced to the voltage of the tank 112. This greatly reduces the voltage output requirements of the hydraulic motor/generator 215.

In this embodiment, a first part of the SCFCL system is referenced to ground, such as the hydraulic power supply 210.

The second part of the system is referenced to a much higher voltage, such as the voltage of the floating tank 112. The components referenced to this higher voltage include the cryogenic cooler 117 and the hydraulic motor/generator 215. The interface or conduit between these two parts of the system is electrically non-conductive, such as rubber hoses filled with hydraulic fluid.

In operation, the hydraulic power supply 210 is powered by a voltage, referenced to ground, and is used to create a flow of hydraulic fluid at a predetermined pressure and rate. This hydraulic fluid flows through the supply system 216 to the hydraulic motor/generator 215, which is referenced to a voltage different than ground, such as the voltage of the tank 112. The fluid then passes through the hydraulic motor/generator 215 and returns to the power supply 210, via return system 217. Rubber hoses may make up the supply system 216 and the return system 217. The hydraulic fluid is used to generate energy by the hydraulic motor/generator 215. As stated above, the energy may be mechanical energy (i.e. a hydraulic motor) or electrical energy (a hydraulic generator). In some embodiments, a generator is used to create a voltage, which is referenced to the voltage of the tank 112. This voltage is used to power the compressor and any other components which are on the platform 160, such as control and sensor electronics.

Those of the art will recognize that the present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A fault current limiting system, comprising:
    a super conducting fault current limiter, in communication with a power transmission network, having an enclosure, electrically isolated from ground, so as to be at a voltage different than ground;
    an insulating support, positioned between said enclosure and ground, so as to maintain said voltage different than ground;
    a hydraulic power supply, referenced to ground, to create a flow of hydraulic fluid at a predetermined pressure and flow rate;
    a hydraulic motor or generator, referenced to said voltage different than ground, configured to receive said hydraulic fluid and create energy therefrom; and
    an electrically non-conductive conduit between said hydraulic power supply and said hydraulic motor or generator to carry said hydraulic fluid between said hydraulic power supply and said hydraulic motor of generator.

2. The fault current limiting system of claim 1, wherein said enclosure is electrically floating.

3. The fault current limiting system of claim 1, wherein said super conducting fault current limiter comprises a first terminal and a second terminal in communication with said power transmission network, and said enclosure is electrically connected to one of said first terminal and said second terminal.

4. The fault current limiting system of claim 1, further comprising a platform on which said enclosure rests, said platform elevated above ground by said insulating support, wherein said hydraulic motor or generator is located on said platform.

5. The fault current limiting system of claim 4, further comprising a cryogenic compressor in electrical communication with said hydraulic generator.

6. The fault current limiting system of claim 5, wherein said cryogenic compressor is located on said platform.

7. The fault current limiting system of claim 5, further comprising an additional electrical component powered by said hydraulic generator.

8. The fault current limiting system of claim 4, wherein said hydraulic power supply is not located on said platform, and said conduits extend from said power supply to said hydraulic motor or generator located on said platform.

9. The fault current limiting system of claim 1, wherein said hydraulic fluid has a dielectric breakdown voltage in excess of 35 kV.

* * * * *